United States Patent
Kim et al.

(10) Patent No.: US 10,607,660 B2
(45) Date of Patent: Mar. 31, 2020

(54) NONVOLATILE MEMORY DEVICE AND OPERATING METHOD OF THE SAME

(71) Applicant: SAMSUNG ELECTRONICS CO., LTD., Suwon-si, Gyeonggi-Do (KR)

(72) Inventors: Young-Hwa Kim, Seongnam-si (KR); Tae-Young Oh, Seoul (KR); Jin-Hoon Jang, Uiwang-si (KR); Seok-Jin Cho, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/959,344

(22) Filed: Apr. 23, 2018

(65) Prior Publication Data
US 2019/0027195 A1 Jan. 24, 2019

(30) Foreign Application Priority Data

Jul. 20, 2017 (KR) .................. 10-2017-0092261
Nov. 7, 2017 (KR) .................. 10-2017-0147612

(51) Int. Cl.
*G11C 5/14* (2006.01)
*G11C 11/4093* (2006.01)
(Continued)

(52) U.S. Cl.
CPC ............ *G11C 5/14* (2013.01); *G11C 11/4074* (2013.01); *G11C 11/4093* (2013.01); *G11C 11/4096* (2013.01)

(58) Field of Classification Search
CPC ... G11C 5/14; G11C 11/4074; G11C 11/4093; G11C 11/4096
See application file for complete search history.

(56) References Cited

U.S. PATENT DOCUMENTS 5,886,561 A   3/1999 Eitan et al.
7,630,229 B2 * 12/2009 Katayama ............. G11C 11/417
                                                                    365/154
(Continued)

FOREIGN PATENT DOCUMENTS

CN     106873696 A    6/2017
KR     100152354 B1   1/1998
(Continued)

OTHER PUBLICATIONS

Office Action From Singapore Patent Office Corresponding to Application SG 10201804015P, dated Feb. 19, 2019.
(Continued)

*Primary Examiner* — Tri M Hoang
(74) *Attorney, Agent, or Firm* — Volentine, Whitt & Francos, PLLC

(57) ABSTRACT

A memory device having a plurality of voltage regions and a method of operating the same are provided. The memory device includes a memory cell array, a data path region including data processing blocks transmitting read/write data from/to the memory cell array during read/write operations, and a control signal path region including control blocks controlling the data processing blocks during the read/write operations. The data path region selectively receives a first high power voltage or a first low power voltage in accordance with an operating mode of the memory device. The control signal path region receives the first high power voltage regardless of the operating mode.

20 Claims, 10 Drawing Sheets

(51) Int. Cl.
*G11C 11/4074* (2006.01)
*G11C 11/4096* (2006.01)

(56) References Cited

U.S. PATENT DOCUMENTS

| | | | |
|---|---|---|---|
| 7,782,701 B2 | 8/2010 | Seo et al. | |
| 8,406,075 B2* | 3/2013 | Lee | G11C 11/413 |
| | | | 365/226 |
| 8,415,972 B2 | 4/2013 | Rogers et al. | |
| 8,971,097 B2 | 3/2015 | Ngo et al. | |
| 9,337,660 B1 | 5/2016 | Bourstein | |
| 2008/0018381 A1 | 1/2008 | Shin | |
| 2010/0244942 A1 | 9/2010 | Okano | |
| 2012/0117391 A1 | 5/2012 | Jacquet et al. | |
| 2012/0327726 A1* | 12/2012 | Tsern | G11C 11/4074 |
| | | | 365/189.11 |
| 2014/0301259 A1 | 10/2014 | Homchaudhuri et al. | |
| 2014/0313819 A1* | 10/2014 | Choi | G11C 5/14 |
| | | | 365/156 |
| 2015/0036446 A1 | 2/2015 | Kenkare et al. | |
| 2015/0340073 A1 | 11/2015 | Seo et al. | |
| 2016/0036434 A1 | 2/2016 | Hara et al. | |
| 2016/0071674 A1 | 3/2016 | Kitora et al. | |
| 2016/0094121 A1 | 3/2016 | Cowley et al. | |
| 2016/0111134 A1 | 4/2016 | Kim et al. | |
| 2016/0125920 A1* | 5/2016 | Kim | G11C 5/147 |
| | | | 365/189.05 |
| 2016/0306412 A1 | 10/2016 | Kolla et al. | |
| 2016/0308372 A1 | 10/2016 | Kolla et al. | |
| 2016/0349827 A1 | 12/2016 | Idgunji et al. | |
| 2017/0075401 A1 | 3/2017 | Choi et al. | |
| 2017/0147053 A1 | 5/2017 | Chang et al. | |
| 2017/0169875 A1* | 6/2017 | Gans | G11C 11/4074 |
| 2017/0194483 A1 | 7/2017 | Ng et al. | |
| 2017/0194957 A9 | 7/2017 | Simmonds | |

FOREIGN PATENT DOCUMENTS

| | | |
|---|---|---|
| KR | 1020070109429 A | 11/2007 |
| WO | WO2017098211 A1 | 6/2017 |

OTHER PUBLICATIONS

Office Action From European Patent Office Corresponding to Application EP 18 18 4828.4, dated Mar. 8, 2019.
Office Action From European Patent Office Corresponding to Application EP 18 18 4829.2, dated Mar. 13, 2019.
Office Action From Intellectual Property of Singapore Corresponding to Singapore Patent 10201806186U dated May 30, 2019.

* cited by examiner

VDD1 ─────────────────
VDD2H ─────────────────
VDD2L ─────────────────
VINT ─────────────────
VPWR_INT ─────────────────
VPWR_2H ─────────────────

|  |  | SW_A | SW_B | SW_C | SW_D | SW_E |
|---|---|---|---|---|---|---|
| VDD2H only+PG=VPWR_2H | | X | X | X | X | 1/0 |
| DVFS | VINT=VDD2L | 1 | X | 0 | X | X |
| | VINT=VDD2H | 0 | X | 1 | X | X |
| | VPWR_INT=VDD2L+PG | 1 | 1/0 | 0 | 0 | X |
| | VPWR_INT=VDD2H+PG | 0 | 1/0 | 1 | 1/0 | X |

NONVOLATILE MEMORY DEVICE AND OPERATING METHOD OF THE SAME

CROSS-REFERENCE TO RELATED APPLICATIONS

This application claims the benefit of Korean Patent Application No. 10-2017-0092261 filed on Jul. 20, 2017 and Korean Patent Application No. 10-2017-0147612 filed on Nov. 7, 2017, the collective subject matter of which is hereby incorporated by reference.

BACKGROUND

The inventive concept relates to memory devices, and more particularly to memory devices including a plurality of voltage regions, as well as methods for operating the same.

The capacity and speed of contemporary semiconductor memory devices used in high performance electronic systems are steadily increasing. The dynamic random access memory (DRAM) is one example of contemporary semiconductor memory devices. DRAM is a type of volatile memory and stores and retrieves data in accordance with electrical charge stored on a capacitor.

DRAM may perform internal operations using a variety of voltages (e.g., voltages generated at respective levels). It is also necessary to control the generation of certain voltages in accordance with desired operation performance characteristics, such as the desired frequency of a signal. As the number and variation of desired voltages increase, the corresponding arrangement of power rails required to communicate (e.g., transmit) such voltages may become quite complicated. Further, the number and configuration of circuits and constituent components (e.g., level shifters) associated with voltage regions and power rails used to generate and distribute desired voltages across a semiconductor memory device may adversely increase the power consumption of DRAM and/or its chip size.

SUMMARY

The inventive concept provides a memory device capable of improving implementation simplicity and having low power consumption by efficiently managing internally used power voltages.

In one embodiment the inventive concept provides a memory device including: a memory cell array, a data path region including data processing blocks that transmit write data to the memory cell array during a write operation and transmit read data from the memory cell array during a read operation, and a control signal path region including control blocks that controlling the data processing blocks during the write operation and the read operation, wherein the data path region selectively receives a first high power voltage or a first low power voltage in accordance with an operating mode of the memory device, and the control signal path region receives the first high power voltage regardless of the operating mode.

In another embodiment the inventive concept provides a memory device including; a memory cell array, a data path region including data processing blocks transmitting read data from the memory cell array during a read operation and transmitting write data to the memory cell array during a write operation, a control signal path region including control blocks controlling the data processing blocks during the read operation and the write operation, first and second power rails transmitting power voltages used in the memory device and a switch unit including a plurality of switches controlling a connection state between the first and second power rails, wherein the data path region is connected to the first power rail, the control signal path region is connected to the second power rail, the data path region receives at least two power voltages through the first power rail, and the control signal path region receives one power voltage through the second power rail.

In still another embodiment the inventive concept provides a method of operating a memory device, wherein the memory device includes a data path region including data processing blocks processing data during memory operations and a control signal path region including control blocks controlling the data processing blocks during the memory operations. The method includes; providing a first high power voltage to the data path region and the control signal path region in a normal operating mode, controlling a switch based on a dynamic voltage and frequency scaling (DVFS) operation as the memory device enters a low performance operating mode, and continuously providing the first high power voltage to the control signal path region and providing a first low power voltage to the data path region in the low performance operating mode.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figures 1, 2:
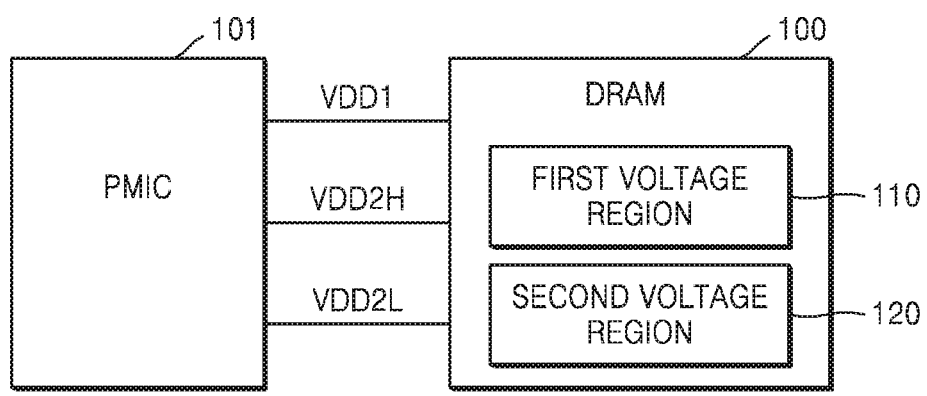
FIG. 1 is a block diagram illustrating a memory system according to an embodiment of the inventive concept.
FIG. 2 illustrates an example of power rails provided in dynamic random access memory (DRAM)

FIG. 1 is a block diagram illustrating a memory system according to an embodiment of the inventive concept. Here, a DRAM 100 is assumed as an illustrative example, but the inventive concept are not limited thereto. For example, those skilled in the art will recognize that the following teachings may be applied to other types of volatile memory or non-volatile memory (e.g., a resistive memory device or a flash memory) according to other embodiments of the inventive concept.

DRAM 100 may receive various voltages having different levels (e.g., power voltages, including in the illustrated example of FIG. 1 a first power voltage VDD1, a second high power voltage VDD2H, and a second low power voltage VDD2L) from an externally provided power management integrated circuit (PMIC) 101. The DRAM 100 is said to be "driven" (i.e., functionally operates) in response to one or more of the provided power voltage(s) in accordance with one or more specifications. Thus, DRAM 100 may be understood as being driven in accordance with a low power double data rate (LPDDR) specification, for example.

In the illustrated example of FIG. 1, the first power voltage VDD1 is assumed to have the highest level, the second high power voltage VDD2H is assumed to have the second highest level, and the second low power voltage VDD2L is assumed to have the lowest level. However, the terminology, respective voltage levels, and relative voltage relationships among power voltages will vary with semiconductor memory design.

It will be further understood that DRAM 100 may correspond to one of many different types of semiconductor memory devices. That is, DRAM 100 may correspond to one of a double data rate synchronous dynamic random access memory (DDR SDRAM), a low power double data rate (LPDDR) SDRAM, a graphics double data rate (GDDR) SDRAM, a Rambus dynamic random access memory (RDRAM), and the like. In addition, the manner in which DRAM 100 variously communicates with memory system or external components will be defined according to an operative specification. Thus, DRAM 100 may communicate according to an LPDDR specification, such as LPDDR5.

As conceptually illustrated in FIG. 1, DRAM 100 may include a first voltage region 110 and a second voltage region 120, as well as various circuit blocks related to memory operations. Here, the first voltage region 110 may include first circuit blocks and the second voltage region 120 may include second (or other) circuit blocks. For example, the first circuit blocks of the first voltage region 110 may include one or more data processing blocks used to transmit "write data" being written in a memory cell array of the DRAM and/or "read data" being retrieved from the memory cell array. And the second circuit blocks of the second voltage region 120 may include one or more control blocks use to control the data processing blocks of the first voltage region 110. With these exemplary assumptions in mind, the first voltage region 110 may be referred to as a "data path region" including one or more data processing blocks while the second voltage region 120 may be referred to as a "control signal path region" including one or more control signal blocks.

According to an embodiment of the inventive concept, the data processing blocks of the first voltage region 110 may selectively receive one or more power voltages, whereas the control blocks of the second voltage region 120 receives a continuous (i.e., steady or constant) power voltage. For example, among the power voltage examples described above, either one or both of the second high power voltage VDD2H and the second low power voltage VDD2L may be selectively provided to the first voltage region 110, whereas the second high power voltage VDD2H may be continuously provided to the second voltage region 120. Of course, the selective provision of one or more power voltages to the first voltage region 110 and/or the continuous provision of a power voltage to the second voltage region 120 is a matter of design choice. In certain embodiments of the inventive concept, the first power voltage VDD1 described above may be continuously provided to the second voltage region 120.

Thus, the first voltage region 110 may receive the second high power voltage VDD2H or the second low power voltage VDD2L in accordance with an operating mode of DRAM 100. For example, when the DRAM 100 enters a low power mode (e.g., a low performance operating mode or a low speed operating mode), the first voltage region 110 may receive the second low power voltage VDD2L. On the other hand, when the DRAM 100 enters a normal power mode (e.g., a high performance operating mode or a high speed operating mode), the first voltage region 110 may receive the second high power voltage VDD2H.

As may be understood from the above-described embodiment of the inventive concept, two or more voltage regions may be defined in accordance with a data path region and a control signal path region of a semiconductor memory device, and respective voltage regions may thereafter receive one or more power voltage(s). In this regard, power rails used to transmit power voltage(s) in accordance with defined voltage regions may be variously and advantageously arranged in the semiconductor memory device. Further, this approach may make it unnecessary to arrange an additional circuit block(s), such as level shifter(s), to correspond to circuit blocks included in the same voltage region. Thus, embodiments of the inventive concept may be used to reduce design complexity, design area requirements and/or power consumption in semiconductor memory devices.

FIG. 2 illustrates an example of power rails that may be used in relation to the embodiment of FIG. 1.

The various power voltages of FIG. 1 may be transmitted by various power rails in the DRAM 100. For example, in FIG. 2, a VDD1 power rail for transmitting the first power voltage VDD1, a VDD2H power rail for transmitting the second high power voltage VDD2H, and a VDD2L power rail for transmitting the second low power voltage VDD2L are illustrated. In addition, in FIG. 2, a VINT power rail for transmitting a first internal voltage VINT, a VPWR_INT power rail for transmitting a second internal voltage VPWR_INT, and a VPWR_2H power rail for transmitting a third internal voltage VPWR_2H are shown. Here, the first internal voltage VINT, second internal voltage VPWR_INT, and third internal voltage VPWR_2H are voltages used internal to the DRAM 100. The VINT power rail, VPWR_INT power rail, and VPWR_2H power rail may be referred to as internal power rails because they are arranged to transmit a power voltage to various circuit blocks in the DRAM 100.

The various circuit blocks of DRAM 100 may be connected to the VINT power rail and receive the second high power voltage VDD2H or the second low power voltage VDD2L. Alternately, the various circuit blocks of DRAM 100 may be connected to the VPWR_INT power rail and may receive the second high power voltage VDD2H or the second low power voltage VDD2L. Of note, other circuit blocks in the DRAM 100 may be connected to the VPWR_2H power rail and may receive the second high power voltage VDD2H.

Referring to FIGS. 1 and 2, the DRAM 100 may internally perform dynamic voltage and frequency scaling. For example, the DRAM 100 may provide the second high power voltage VDD2H having a high level or the second low power voltage VDD2L to one or more circuit blocks in order to control operation performance. The above voltage switching operation may be referred to as dynamic voltage and frequency scaling (DVFS). That is, the first voltage region 110 of the above DRAM 100 may receive the second high power voltage VDD2H or the second low power voltage VDD2L in accordance with internal voltage scaling. Therefore, the first voltage region 110 may be referred to as the DVFS region.

The VINT power rail for transmitting the first internal voltage VINT may provide the second high power voltage VDD2H or the second low power voltage VDD2L to the first voltage region 110. Therefore, the VINT power rail may be electrically connected to the VDD2H power rail and the VDD2L power rail. For example, the VINT power rail may be connected to the VDD2H power rail and the VDD2L power rail via a switch (e.g., a DVFS switch).

On the other hand, the VPWR_INT power rail for transmitting the first internal voltage VINT may be connected to the VINT power rail through a power switch and/or the DVFS switch. In addition, the VPWR_2H power rail may be arranged in relation to a circuit block that exclusively uses the second high power voltage VDD2H and may be connected to the VDD2H through the power switch, for example.

Power gating may be enabled or disabled to data processing blocks provided in the first voltage region 110. That is, power gating is applied (enabled) to some data processing blocks provided in the first voltage region 110, whereas power gating may not be applied (disabled) to other data processing blocks. Hence, the data processing blocks to which power gating is disabled may receive the second high power voltage VDD2H or the second low power voltage VDD2L via the VINT power rail. In addition, the data processing blocks to which power gating is enabled may receive the second high power voltage VDD2H or the second low power voltage VDD2L via the VPWR_INT power rail.

Alternately, when the second voltage region 120 of the above DRAM 100 receives the second high power voltage VDD2H, the second voltage region 120 may receive the second high power voltage VDD2H through the VDD2H power rail or the VPWR_2H power rail. When the second voltage region 120 receives the first power voltage VDD1, the second voltage region 120 may receive the first power source voltage VDD1 through the VDD1 power rail.

Figure 3:
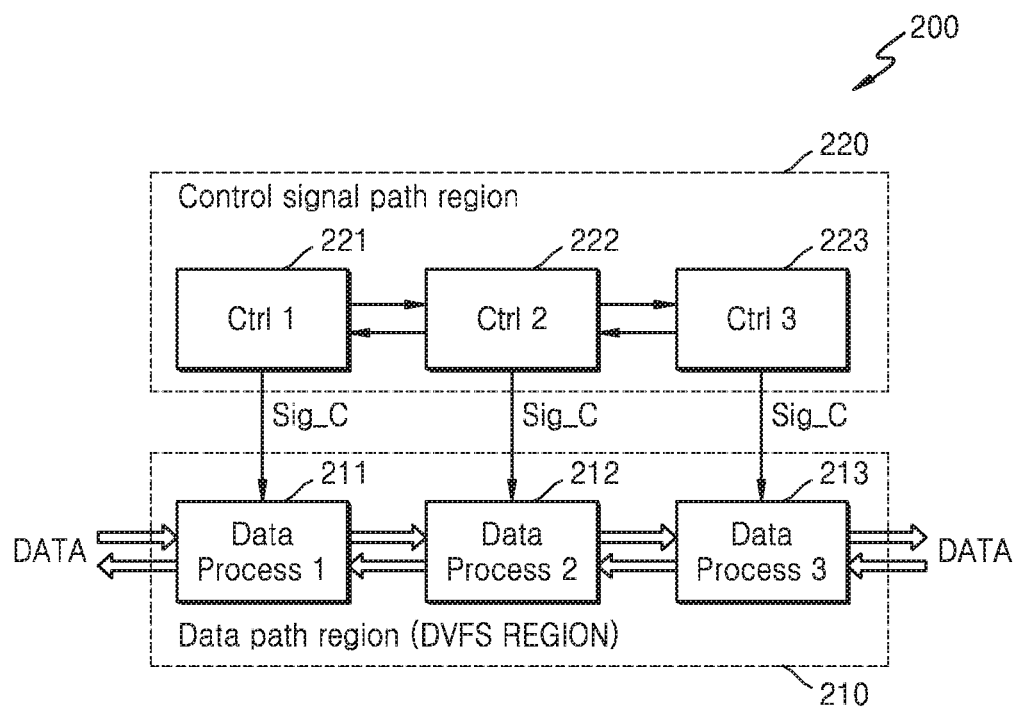
FIG. 3 is a block diagram illustrating a semiconductor memory device according to an embodiment of the inventive concept.

FIG. 3 is a block diagram illustrating a semiconductor memory device according to an embodiment of the inventive concept.

Analogous to the illustrated embodiment of FIG. 1, FIG. 3 shows a DRAM 200 includes a first voltage region 210 and a second voltage region 220, wherein the first voltage region 210 includes one or more data processing blocks 211, 212 and 213 for processing data DATA, and the second voltage region 220 includes one or more control blocks 221, 222 and 223 for respectively or collectively controlling the data processing blocks 211, 212 and 213. In FIG. 3, the number of data processing blocks 211, 212 and 213 is assumed to be equal to the number of control blocks 221 to 223, but this need not be the case in other embodiments of the inventive concept. That is, one or more control block(s) of the second voltage region 220 may be variously configured and operated to control one or more data processing blocks of the first voltage operating region consistent with varying design requirements for the constituent semiconductor memory device.

In the illustrated embodiment of FIG. 3, each of the first, second and third data processing blocks 211, 212 and 213 may be used to variously process (e.g., computational and/or logic processing) the received data DATA under the control of one or more control block(s) of the second voltage region 220. In response to read/write operations being performed by the DRAM 200, the transmission of data between the first, second and/or third data processing blocks 211, 212 and 213 may be unidirectional or bidirectional.

As illustrated in FIG. 3, certain embodiments of the inventive concept may use respective control blocks (e.g., 221, 22 and 223) to control a corresponding data processing block (e.g., 211, 212, and 213) in accordance with exchanged control information (e.g., control information communicated by a control signal, Sig_C). Thus, in the illustrated embodiment of FIG. 3, the second control block 222 is assumed to output a control signal Sig_C controlling the second data processing block 212, such that the second data processing block 212 transmits the data DATA to at least one of the first data processing block 211 and the third data processing block 213.

In FIG. 3, the first voltage region 210 corresponds to a DVFS region. Therefore, each of the first, second and third data processing blocks 211, 212 and 213 receives at least one of the second high power voltage VDD2H and the second low power voltage VDD2L. For example, in accordance with a selected operating mode for the DRAM 200, and based on an operating mode-corresponding DVFS switching operation for the DRAM 200, the second high power voltage VDD2H and/or the second low power voltage VDD2L may be provided to the first voltage region 210. In contrast, one power voltage (e.g., the second high power voltage VDD2H) is continuously provided to the second voltage region 220, regardless of DRAM operating mode.

Figure 4:
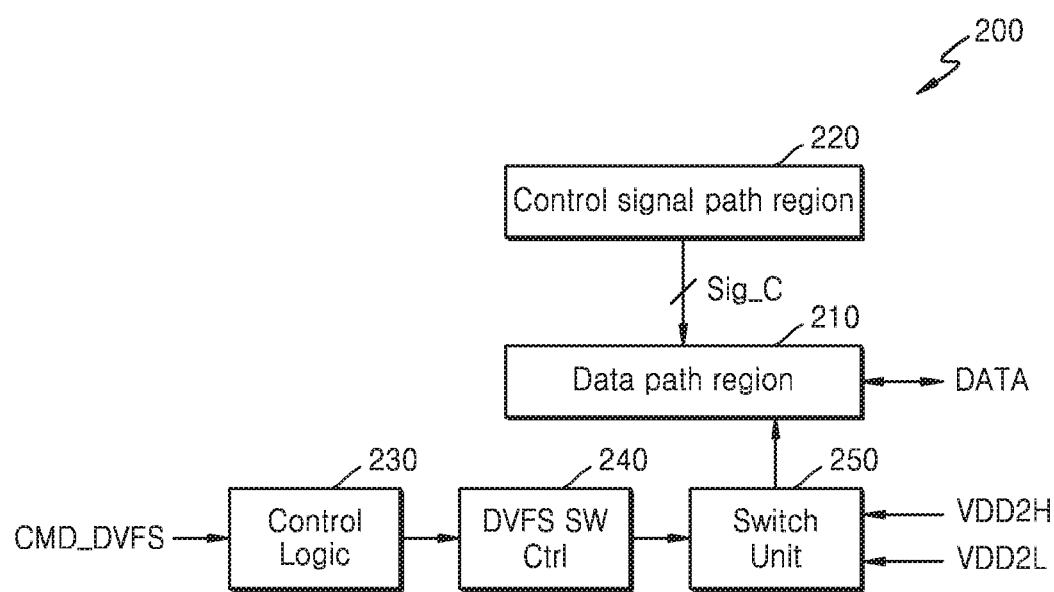
FIG. 4 is a block diagram further illustrating one particular implementation example of a dynamic voltage and frequency scaling (DVFS) switching function that may be used by the semiconductor memory device 200 of FIG. 3.

FIG. 4 is a block diagram further illustrating one possible implementation example for the DVFS switching function associated with DRAM 200 of the FIG. 3.

Referring to FIGS. 3 and 4, DRAM 200, including the first voltage region 210 and the second voltage region 220, further includes a control logic 230, a DVFS switch controller 240, and a switch unit 250.

Here, the control logic 230 may be used to perform a command decoding function, receive various commands from a memory controller, decode the commands, and generate corresponding internal control signal(s) controlling various circuit blocks in DRAM 200. For example, the control logic 230 may receive a command associated with DVFS control (e.g., DVFS command CMD_DVFS) and decode the command in order to generate internal control signal(s).

The DVFS switch controller 240 may generate a switch control signal for DVFS control in response to one or more of the internal control signal(s) provided by the control logic 230. The switch unit 250 may include one or more DVFS switches through which the second high power voltage VDD2H or the second low power voltage VDD2L is provided to the first voltage region 210 in response to a switching operation defined by the switch control signal. Alternately, the switch unit 250 of FIG. 4 may further include switches in addition to the DVFS switch that are used to transmit power voltage(s) between the two or more of the various power rails described in relation to FIG. 2.

In FIG. 4 the control logic 230 and the DVFS switch controller 240 are shown as separate circuit blocks and/or associated software/firmware, but this need not be the case in other embodiments of the inventive concept. For example, the function provided by the DVFS switch controller 240 may be subsumed by the control logic 230, such that the control logic 230 decodes the DVFS command CMD_DVFS and generates the switch control signal. In these various configurations, the DVFS function may be controlled according to a selected operating mode for the DRAM 200. For example, the control logic 230 may be used to control the switch unit 250 based on an operating mode signal provided from the memory controller.

Figure 5:
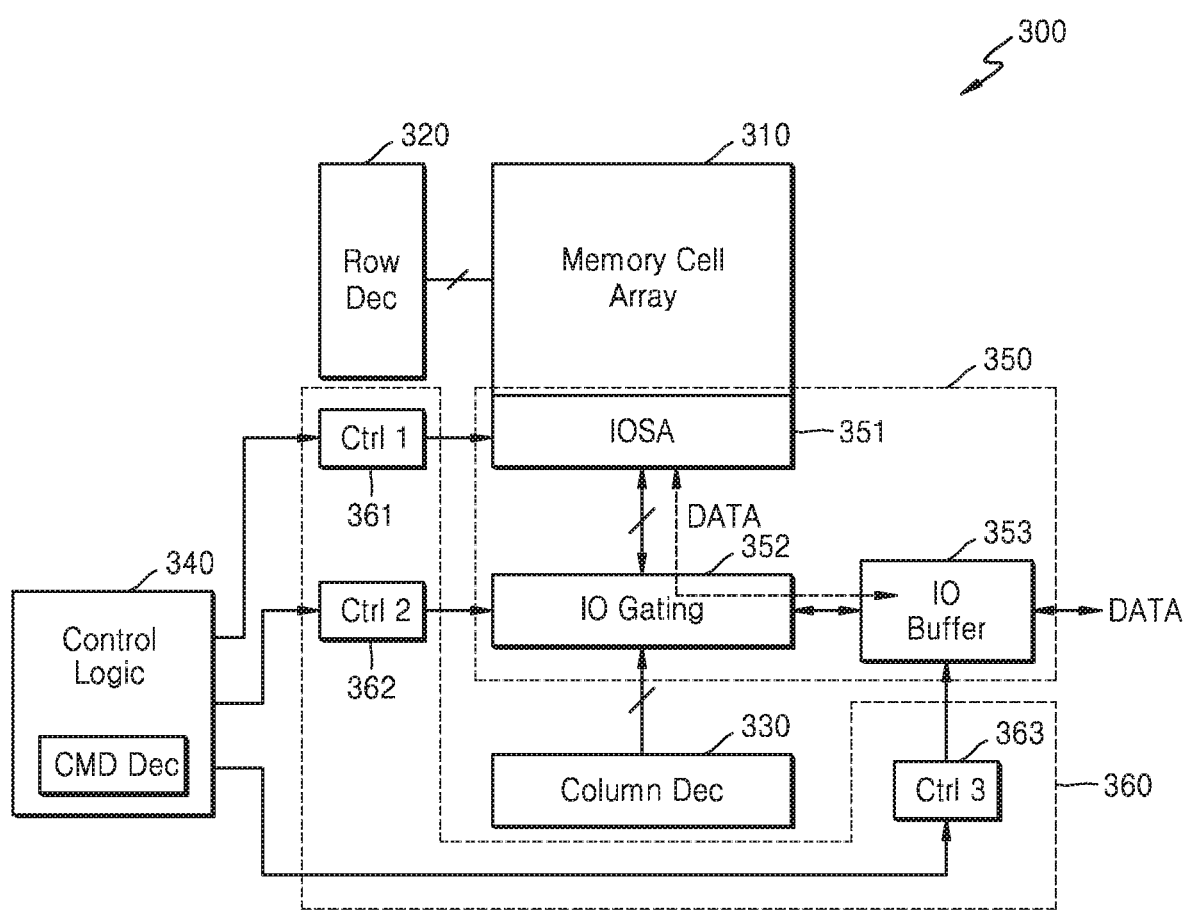
FIG. 5 is a block diagram illustrating an implementation example of DRAM according to an embodiment of the inventive concept.

FIG. 5 is a block diagram illustrating another implementation example of a DRAM 300 according to an embodiment of the inventive concept.

Referring to FIG. 5, DRAM 300 includes a memory cell array 310, a row decoder 320, a column decoder 330, and a control logic 340, where DRAM 300 further includes a first voltage region 350 and a second voltage region 360. The first voltage region 350 corresponds to a data path region (or the DVFS region) and includes one or more data processing blocks. The second voltage region 360 includes one or more control blocks. Here, the first voltage region 350 may include an input and output sense amplifier (IOSA) 351 for amplifying data, an input and output gating circuit 352 for gating data in accordance with a column decoding result, and an input and output buffer 353 for transmitting and receiving data to one or more external circuits. Consistent with the fore-going description, the second voltage region 360 may include control blocks for controlling data processing blocks of the first voltage region 350 (e.g., first, second and third control blocks 361, 362 and 363).

The memory cell array 310 may include memory cells connected via a plurality of word lines and a plurality of bit lines. The row decoder 320 may select the word lines in response to a row address from the outside. In addition, the column decoder 330 may select the bit lines in response to a column address from the outside. During a write operation, write data (DATA) is provided to the selected memory cell of the memory cell array 310 based on the selection operation of the row decoder 320 and the column decoder 330. During a read operation, read data (DATA) retrieved from the memory cell array 310 based on the selection operation of the row decoder 320 and the column decoder 330 is provided to circuitry external to DRAM 300.

The control logic 340 may be used to control all operations performed by DRAM 300. For example, the control logic 340 may include a command decoder and may control various circuit blocks of DRAM 300 in response to a command received from a memory controller. Thus, the control logic 340 may control the first, second and third control blocks 361, 362 and 363 of the second voltage region 360, where the first, second and third control blocks 361, 362 and 363 may be used to control data processing blocks in the first voltage region 350. During a write operation, based on control by the first, second and third control blocks 361, 362 and 363, the write data (DATA) is provided to the memory cell array 310 through the input and output buffer 353, the input and output gating circuit 352, and the input and output sense amplifier 351. During a read operation, based on control by the first, second and third control blocks 361, 362 and 363, the read data (DATA) is provided to external circuitry through the input and output sense amplifier 351, the input and output gating circuit 352, and the input and output buffer 353.

Although not shown in FIG. 5, the DVFS switch in the above-described embodiment may be provided in DRAM 300, and under the control of the control logic 340, the second high power voltage VDD2H or the second low power voltage VDD2L may be provided to the first voltage region 350. That is, the input and output sense amplifier 351, the input and output gating circuit 352, and the input and output buffer 353 may process data (DATA) using the second high power voltage VDD2H in certain operating mode(s) and/or process data (DATA) using the second low power voltage VDD2L in other operating mode(s).

The layout and constituent nature of the first voltage region 350 and the second voltage region 360 shown in the embodiment of FIG. 5 are merely exemplary. For example, during data read/write operations, other various circuit blocks may be further provided on the path through which the read/write data (DATA) is transmitted (i.e., the first voltage region 350 including, for example, a data bus, a bus control circuit, a data serializer, etc.).

Other various kinds of circuit blocks included in the second voltage region 360, such as the memory cell array 310, the row decoder 320, and the column decoder 330. The control logic 340 may be also included in the second voltage region 360. Of note in relation to these exemplary configurations, the memory cell array 310, the row decoder 320, the column decoder 330, and the control logic 340 may continuously receive the second high power voltage VDD2H.

According to an implementation example, the first voltage region 350 and the second voltage region 360 may be functionally and physically separate from each other. That is, according to a function of a circuit block, as described above, different physical regions may be defined for the first voltage region 350 and the second voltage region 360.

In addition, although not described in the above-described embodiments, other than the first voltage region 350 and the second voltage region 360, a voltage region including circuit blocks that use the second internal voltage VPWR_INT and the third internal voltage VPWR_2H may be further defined, where the voltage regions may be functionally and/or physically separate from each other.

As the voltage regions are separate from each other, circuit blocks corresponding to the same voltage region are adjacent to each other (or formed in the same well). Therefore, the above-described power rails may be optimally arranged to correspond to the respective voltage regions. In this manner, the number of level shifters required to change power voltage level(s) may be reduced, and the DVFS function may be efficiently provided.

Figure 6:
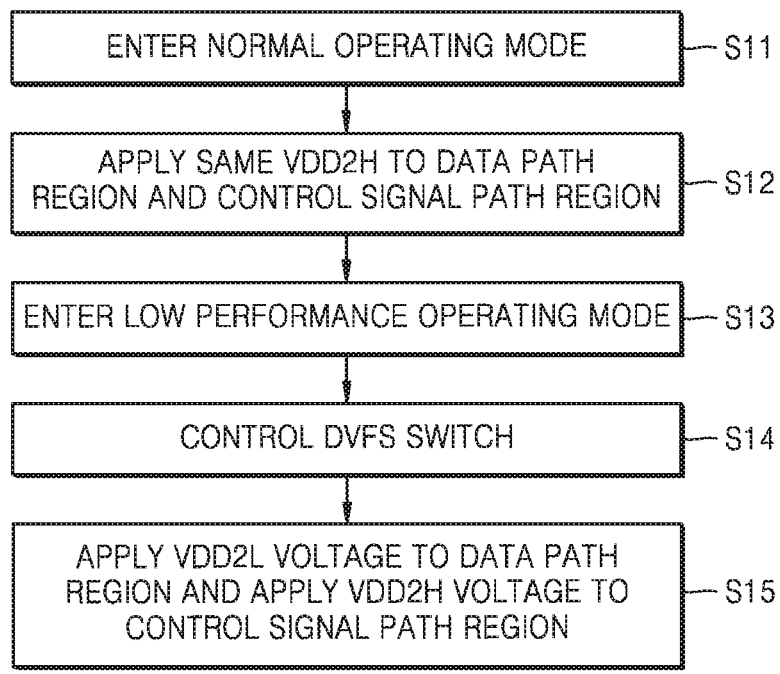
FIG. 6 is a flowchart illustrating a method of operating a memory device according to an embodiment of the inventive concept.

FIG. 6 is a flowchart summarizing a method of operating a memory device according to an embodiment of the inventive concept.

Referring to FIG. 6, a memory device is assumed to operate in one of various operating modes. For example, the memory device may operate in a normal operating mode (or a high performance operating mode) or in a low performance operating mode under the control of a memory controller. The method of FIG. 6 is assumed to begin, for purposes of this description, when the memory device enters the normal operating mode (S11).

As the memory device enters the normal operating mode, the second high power voltage VDD2H is provided to the above-described data path region through the DVFS function so that the same second high power voltage VDD2H may be applied to the data path region and a control signal path region (S12). Then, as an operating mode of the memory device changes, the memory device is assumed to enter the low performance operating mode (S13) and a DVFS switch control operation is performed through the DVFS function (S14). Therefore while the second low power voltage VDD2L is applied to the above-described data path region, the second high power voltage is continuously applied to the above-described control signal path region (S15).

An example in which the power voltage in the memory device is controlled through various kinds of switches including the DVFS switch will now be described.

Figure 7:
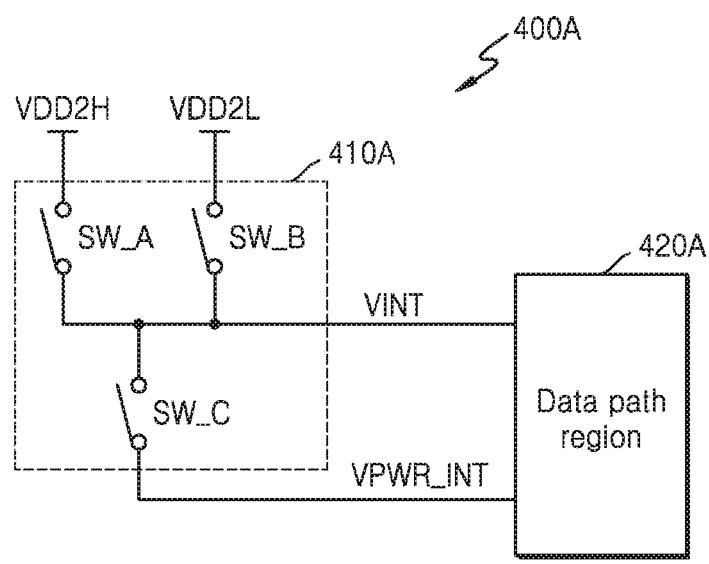
FIG. 7 is a block diagram illustrating an example of switching a power voltage provided to a data path region according to a DVFS function.

FIG. 7 is a block diagram illustrating an example of switching a power voltage provided to a data path region according to a DVFS function.

Referring to FIG. 7, a memory device 400A (e.g., a DRAM) may include a switch unit 410A and a data path region 420A. Although not shown in FIG. 7, the memory device 400A may further include the above-described control signal path region. In addition, the switch unit 410A may include one or more DVFS switches for the DVFS function and may further include one or more switches for switching between power rails.

For example, the switch unit 410A may include first, second and third switches SW_A, SW_B and SW_C, where the first switch SW_A provides the second high power voltage VDD2H to the VINT power rail based on the switching operation and the second switch SW_B provides the second low power voltage VDD2L to the VINT power rail based on the switching operation. The first and second switches SW_A and SW_B for the DVFS function may be referred to as DVFS switches. On the other hand, the third switch SW_C provides the first internal voltage VINT applied to the VINT power rail to the VPWR_INT power rail and controls whether to block power supply to the VPWR_INT power rail so that the third switch SW_C may be referred to as a power gating switch.

According to an embodiment, the data path region 420A may be connected to at least one power rail. In FIG. 7, it is illustrated that the data path region 420A is connected to the VINT power rail and the VPWR_INT power rail. However, like in the above-described embodiment, the data path region 420A may be connected only to the VINT power rail or may be connected only to the VPWR_INT power rail.

Assuming that the data path region 420A is connected to the VINT power rail and the VPWR_INT power rail, the data path region 420A may include data processing block(s) (e.g., a first data processing blocks) to which power gating is not applied and data processing block(s) (e.g., a second data processing blocks) to which power gating is applied. The first data processing blocks may receive the second high power voltage VDD2H or the second low power voltage VDD2L through the VINT power rail. In addition, second data processing blocks may receive the second high power voltage VDD2H or the second low power voltage VDD2L through the VPWR_INT power rail. Therefore, in a selected operating mode (e.g., a low power mode or a sleep mode) of the memory device 400A, the third switch SW_C is turned OFF such that the supply of a power voltage to the second data processing blocks is disabled.

Hereinafter, various switching operations for transmitting a power voltage used in a semiconductor memory device according to embodiments of inventive concept will be described. For example, power voltages provided to a data path region and a control signal path region may be transmitted through various power rails arranged in the semiconductor memory device (e.g. a DRAM) as in the above-described examples.

Accordingly, a number of items should be considered in relation to embodiments of the inventive concept, such as those providing power voltage(s) to a semiconductor memory device. For example, a plurality of level shifters need not be inserted into constituent circuitry, thereby reducing a large IR-drop caused by the power gating switch and the DVFS switch and improving complicated power rails in accordance with power region separation.

According to the embodiments of the inventive concept, a stack hybrid structured switch and power rail and an optimized power domain are provided. In the stack hybrid structure, a hybrid power rail is optimized by separating a high current path from a low current path so that IR-drop is minimized by a small switch area. In addition, in an optimized power region, only a specific portion of a DRAM chip is set as a DVFS region so that power rails are simplified and insertion of a level shifter is minimized.

FIGS. 8A, 8B, 9 and 10 respectively illustrate implementation examples of switches in DRAM according to an embodiment of the inventive concept.

Figure 8A:
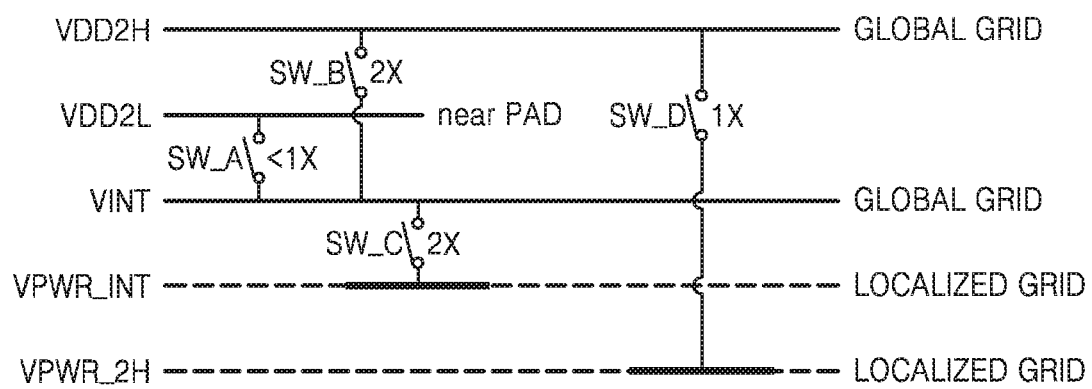
FIGS. 8A, 8B, 9A, 9B and 10 respectively illustrate implementation examples of switches in DRAM according to an embodiment of the inventive concept.

Referring to FIG. 8A, various power rails and switches connected thereto are illustrated. For example, the VDD2H power rail and the VINT power rail (or power grid GRID) are globally arranged in the DRAM and the VDD2L power rail, the VPWR_INT power rail, and the VPWR_2H may be locally arranged in the DRAM. Here, the VDD2L power rail may be arranged proximate to a pad.

The VDD2L power rail and the VINT power rail may be connected to each other via a first switch SW_A, and the VDD2H power rail and the VINT power rail may be connected to each other via a second switch SW_B. Additionally, the VINT power rail and the VPWR_INT power rail may be connected via a third switch SW_C, and the VDD2H power rail and the VPWR_2H power rail may be connected via a fourth switch SW_D. The above structure may be referred to as a two-stack switch since a power voltage is provided to the VPWR_INT power rail through switching twice.

In the context of the foregoing configuration, the second high power voltage VDD2H from the VDD2H power rail may be provided to the VPWR_INT power rail through the VINT power rail. Therefore, in order to minimize IR-drop in the above structure, the second switch SW_B and the third switch SW_C may have relatively large sizes (×2). On the other hand, in a case of a power voltage transmitted by switching once, the size of a switch that controls the transmission may be relatively small. For example, the first switch SW_A and the fourth switch SW_D may have relatively small sizes (×1).

Figure 8B:
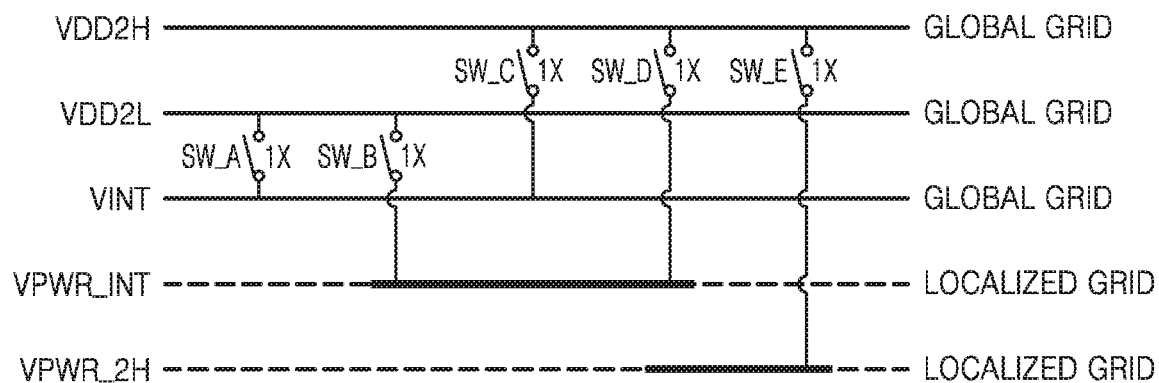

According to the switch arrangement illustrated in FIG. 8B, in order to minimize IR-drop, a power voltage may be provided from one power rail to another power rail by switching once. For example, the VDD2L power rail and the VINT power rail are connected via the first switch SW_A and the VDD2L power rail and the VPWR_INT power rail are connected via the second switch SW_B. In addition, the VDD2H power rail and the VINT power rail may be connected via a third switch SWC, the VDD2H power rail and the VPWR_INT power rail may be connected via a fourth switch SW_D, and the VDD2H power rail and the VPWR_2H power rail may be connected via a fifth switch SW_E. In accordance with the structure illustrated in FIG. 8B, an IR-drop generated when a power voltage is transmitted between power rails may be reduced or minimized.

Like in the above-described embodiment, each of the data path region and the control signal path region may receive a power voltage through one or more power rails. For example, the data path region is connected to the VINT power rail and may receive the second high power voltage VDD2H or the second low power voltage VDD2L. The data path region is connected to the VPWR_INT power rail and receives the second high power voltage VDD2H or the second low power voltage VDD2L. A power gating function may be applied to the data path region. As described above, some circuit blocks of the data path region are connected to the VINT power rail and other circuit blocks may be connected to the VPWR_INT power rail. In addition, the control signal path region may receive the second high power voltage VDD2H through the VDD2H power rail or the VPWR-2H power rail.

Figures 9A, 9B:
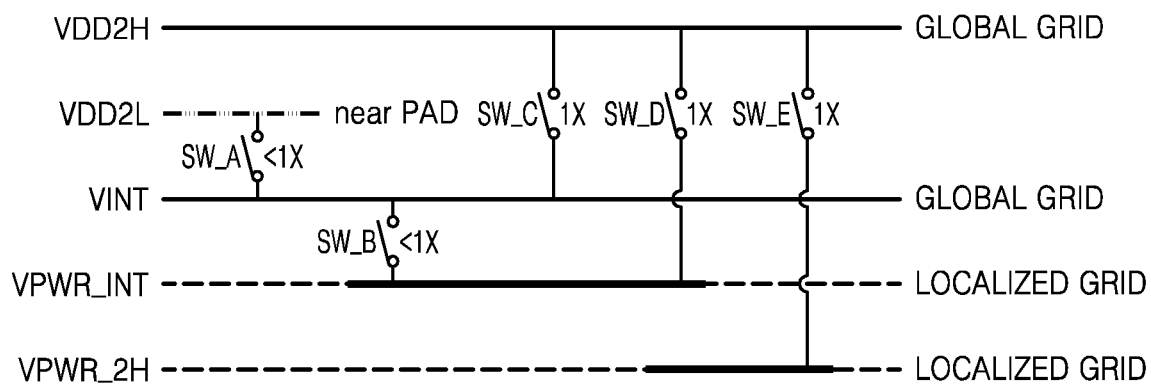

With the foregoing in mind, FIGS. 9A and 9B describe one-stack and two-stack hybrid structures.

Referring to FIG. 9A, the VDD2L power rail and the VINT power rail are connected via the first switch SW_A, the VINT power rail and the VPWR_INT power rail may be connected via the second switch SW_B. In addition, the VDD2H power rail and the VINT power rail are connected via the third switch SW_C, the VDD2H power rail and the VPWR_INT power rail are connected via the fourth switch SW_D, and the VDD2H power rail and the VPWR_2H power rail may be connected via a fifth switch SW_E.

Given the structure illustrated in FIG. 9A, the VPWR_INT power rail may be connected to the VDD2H power rail via the second switch SW_B and the third switch SW_C. In addition, the VPWR_INT power rail may be directly connected to the VDD2H power rail via the fourth switch SW_D. In a case where a low current path uses the second lower power voltage VDD2L, a switch area may be reduced with respect to the same IR-drop. That is, as compared with the third switch SW_C of FIG. 8A, the second switch SW_B of FIG. 9A will occupy a relatively smaller area. In addition, it is not necessary to provide a switch of a large area in order to transmit the second high power voltage VDD2H, and thus increase in a chip area in accordance with increase in switch size may be minimized. In addition, though the number of global power rails increases in FIG. 8B, the number of global power rails (or global power grids GRID) may be reduced in the structure illustrated in FIG. 9A.

Like in the above-described embodiment, the data path region may be connected to at least one of the VINT power rail and the VPWR_INT power rail and the control signal path region may be connected to at least one of the VDD2H power rail and the VPWR_2H power rail.

FIG. 9B is a table listing one operating example for the switches of FIG. 9A. In the table illustrated in FIG. 9B, a value of '0" indicates an OFF switch condition and a value of '1' indicates an ON switch condition, whereas a 'X' indicates a Don't Care condition.

First, in a connection operation between the VDD2H power rail and the VPWR_2H power rail, connection among the first switch SW_A to the fourth switch SW_D is don't care and the fifth switch SW_E may be turned ON or OFF. For a connection between the VINT power rail and the VDD2L power rail, the first switch SW_A is turned ON and the third switch SW_C is turned OFF. The remaining switches are don't care.

For a connection between the VINT power rail and the VDD2H power rail, the first switch SW_A and the second switch SW_B are turned OFF and the third switch SW_C is turned ON. The remaining switches are don't care.

For a connection between the VPWR_INT power rail and the VDD2L power rail, the first switch SW_A is turned ON and the second switch SW_B may be turned ON or OFF. The third switch SW_C and the fourth switch SW_D are turned OFF and the fifth switch SW_E is don't care. And for a connection between the VPWR_INT power rail and the VDD2H power rail, the first switch SW_A is turned OFF, the second switch SW_B and the fourth switch SW_D are turned ON or OFF, the third switch SW_C is turned ON, and the fifth switch SW_E is don't care.

In the above-described embodiment, a switch (e.g., the first switch SW_A and the third switch SW_C in FIG. 9A) connecting the VDD2H power rail to the VINT power rail in relation to the DVFS operation may correspond to the DVFS switch. In addition, a switch (e.g., the second switch SW_B, the fourth switch SW_D, and the fifth switch SW_E) for controlling transmission of a specific power voltage may correspond to a power gating switch.

Figure 10:
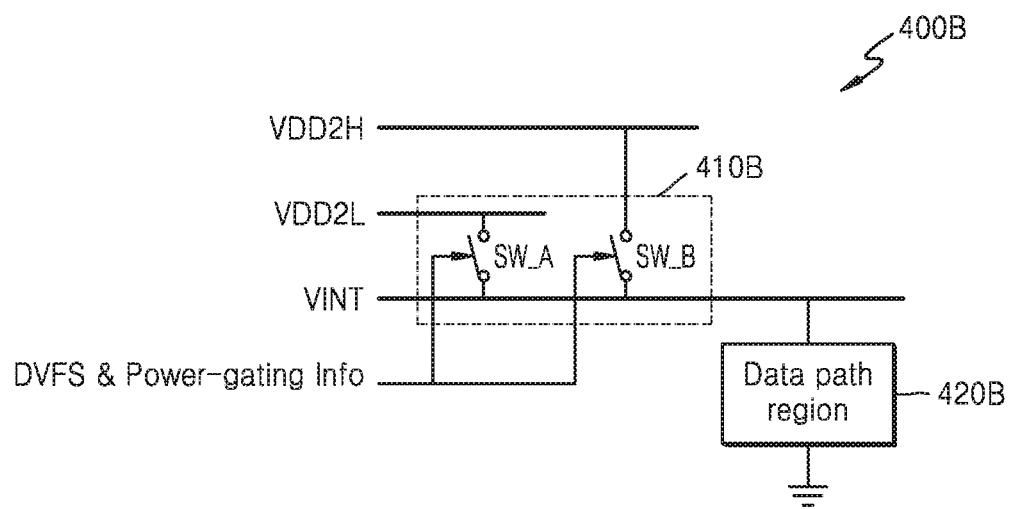

FIG. 10 illustrates an example of controlling a power voltage using a switch that performs functions of the DVFS switch and the power gating switch. In FIG. 10, in relation to the DVFS operation, the VDD2H power rail, the VDD2L power rail, and the VINT power rail are illustrated.

Referring to FIG. 10, a memory device 400B (e.g., a DRAM) may include a switch unit 410B and a data path region 420B and the switch unit 410B may include a first switch SW_A and a second switch SW_B connected to the VINT power rail. The VDD2L power rail and the VINT power rail are connected via the first switch SW_A and the VDD2H power rail and the VINT power rail may be connected via the second switch SW_B. Here, the first switch SW_A and the second switch SW_B may be controlled based on DVFS information and power gating information. Although not shown in FIG. 10, in the DRAM, a circuit for generating an internal control signal by using the DVFS information and the power gating information may be further provided. Like in the above-described embodiment, control logic in the memory device 400B may generate the internal control signal.

The DVFS information and the power gating information are generated in the memory device 400B or may be generated by a memory controller (or an application processor). According to an embodiment of the inventive concept, one of the first switch SW_A and the second switch SW_B is turned ON based on the DVFS information and the second high power voltage VDD2H or the second low power voltage VDD2L may be provided to the VINT power rail. In a selected operating mode such as a power down mode, as both the first switch SW_A and the second switch SW_B are turned OFF based on the power gating information, the supply of a power voltage to a circuit block through the VINT power rail may be disabled.

According to the embodiment of FIG. 10, power gating is performed together by using the DVFS switch. That is, power gating may be simultaneously performed in accordance with power gating information using a switch previously arranged for the DVFS function. Therefore, it is possible to minimize addition of a power gating switch and to minimize IR drop.

Figure 11A:
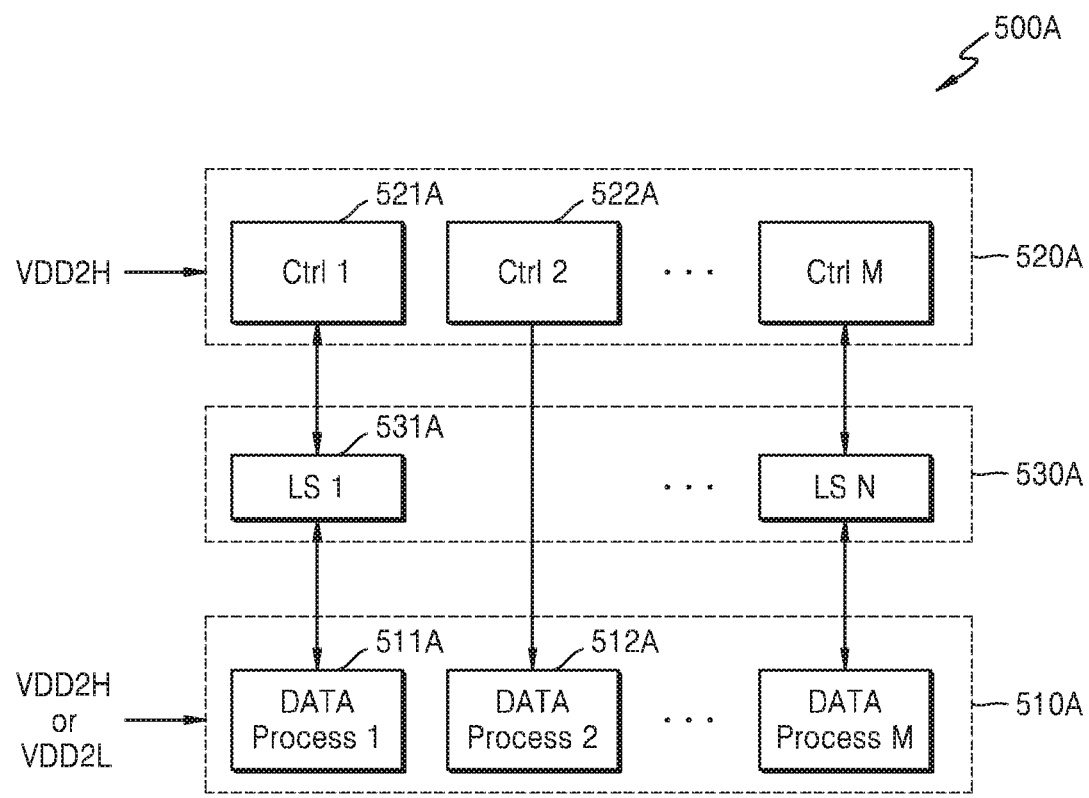
FIGS. 11A and 11B are respective block diagrams illustrating an implementation example of a level shifter in a memory device according to an embodiment of the inventive concept.
Figure 11B:
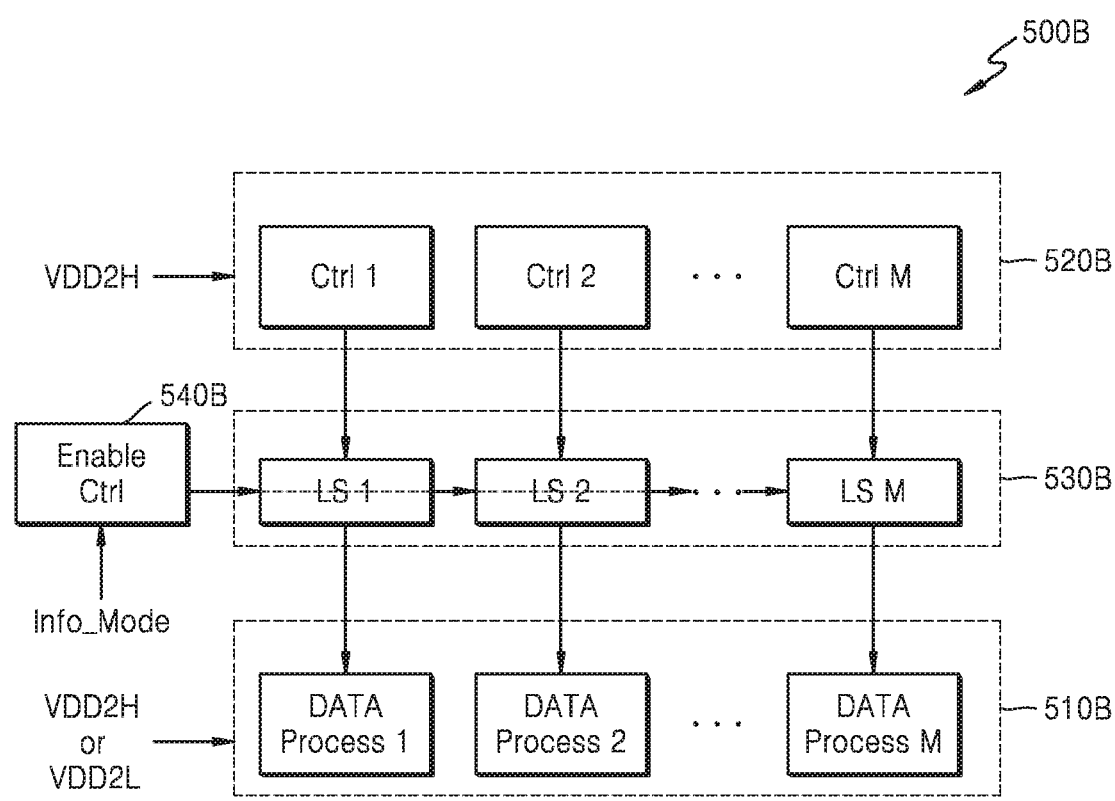

FIGS. 11A and 11B are respective block diagrams illustrating an implementation example of a level shifter in a memory device according to an embodiment of the inventive concept.

Referring to FIG. 11A, a memory device 500A may include a data path region 510A, a control signal path region 520A, and a level shifter region 530A. For example, in FIG. 11A, the data path region 510A includes M data processing blocks and the control signal path region 520A includes M control blocks corresponding to the M data processing blocks. Thus, M control paths may be formed between the M data processing blocks and the M control blocks. As the DVFS function is applied, the second high power voltage VDD2H or the second low power voltage VDD2L is provided to the data path region 510A and the second high power voltage VDD2H may be continuously provided to the control signal path region 520A.

Signal transmission and reception between the data path region 510A and the control signal path region 520A may be bidirectionally or unidirectionally performed. For example, a first data processing block 511A of the data path region 510A and a first control block 521A of the control signal path region 520A may bidirectionally transmit a signal. On the other hand, a second control block 522A of the control signal path region 520A may unidirectionally transmit a signal to a second data processing block 512A of the data path region 510A.

As a signal is bidirectionally transmitted between the first data processing block 511A and the first control block 521A, the signal having the second low power voltage VDD2L from the first data processing block 511A may be provided to the first control block 521A. At this time, the first control block 521A processes the signal by using the second high power voltage VDD2H so that a level shifter 531A may be arranged between the first data processing block 511A and the first control block 521A. On the other hand, the second control block 522A provides a control signal having a level corresponding to the second high power voltage VDD2H to the second data processing block 512A. Since the second high power voltage VDD2H has the same level as or a higher level than the power voltage used by the second data processing block 512A, a level shifter need not be arranged between the second data processing block 512A and the second control block 522A. That is, level shifters may be arranged only on some control paths among the M control paths.

In an example of FIG. 11A, the number of level shifters arranged in the level shifter region 530A is N, where N is an integer smaller than the integer M. Therefore, the number of level shifters provided in the memory device 500A may be reduced.

On the other hand, referring to FIG. 11B, a memory device 500B may include a data path region 510B, a control signal path region 520B, a level shifter region 530B, and an enable controller 540B. For example, in FIG. 11B, the data path region 510B includes M data processing blocks, the control signal path region 520B includes M control blocks, and the level shifter region 530B M includes M level shifters as level shifters are arranged to correspond to data processing blocks (or control blocks). As described above, the second high power voltage VDD2H or the second low power voltage VDD2L is provided to the data path region 510B and the second high power voltage VDD2H may be constantly provided to the control signal path region 520B.

The enable controller 540B may control enable of level shifters in the level shifter region 530B based on mode information Info_Mode. For example, the enable controller 540B may be included in control logic according to the above embodiments and the mode information Info_Mode may include information on the operating mode (e.g., a high performance or a low performance operating mode) of the memory device 500B. In addition, it is assumed that a signal is unidirectionally transmitted between the data path region 510B and the control signal path region 520B.

When the data path region 510B receives the second high power voltage VDD2H in accordance with the operating mode, the enable controller 540B may enable the level shifters in the level shifter region 530B. Therefore, a voltage level of a control signal provided from the control signal path region 520B has a sufficient level for data processing operation and the control signal may be provided the data path region 510B. In addition, when the data path region 510B receives the second low power voltage VDD2L, the enable controller 540B may disable the level shifters in the level shifter region 530B. That is, since the data path region 510B operates by using the second low power voltage VDD2L having a low level, the control signal from the control signal path region 520B may be provided to the data path region 510B without performing level shifting operation.

On the other hand, in the above-described embodiment of FIGS. 11A and 11B, a level shifter may be variously arranged in the memory devices 500A and 500B. According to an embodiment, a level shifter may not be arranged in the same voltage region and the level shifter may be arranged when a signal is transmitted and received between different voltage regions.

Figure 12:
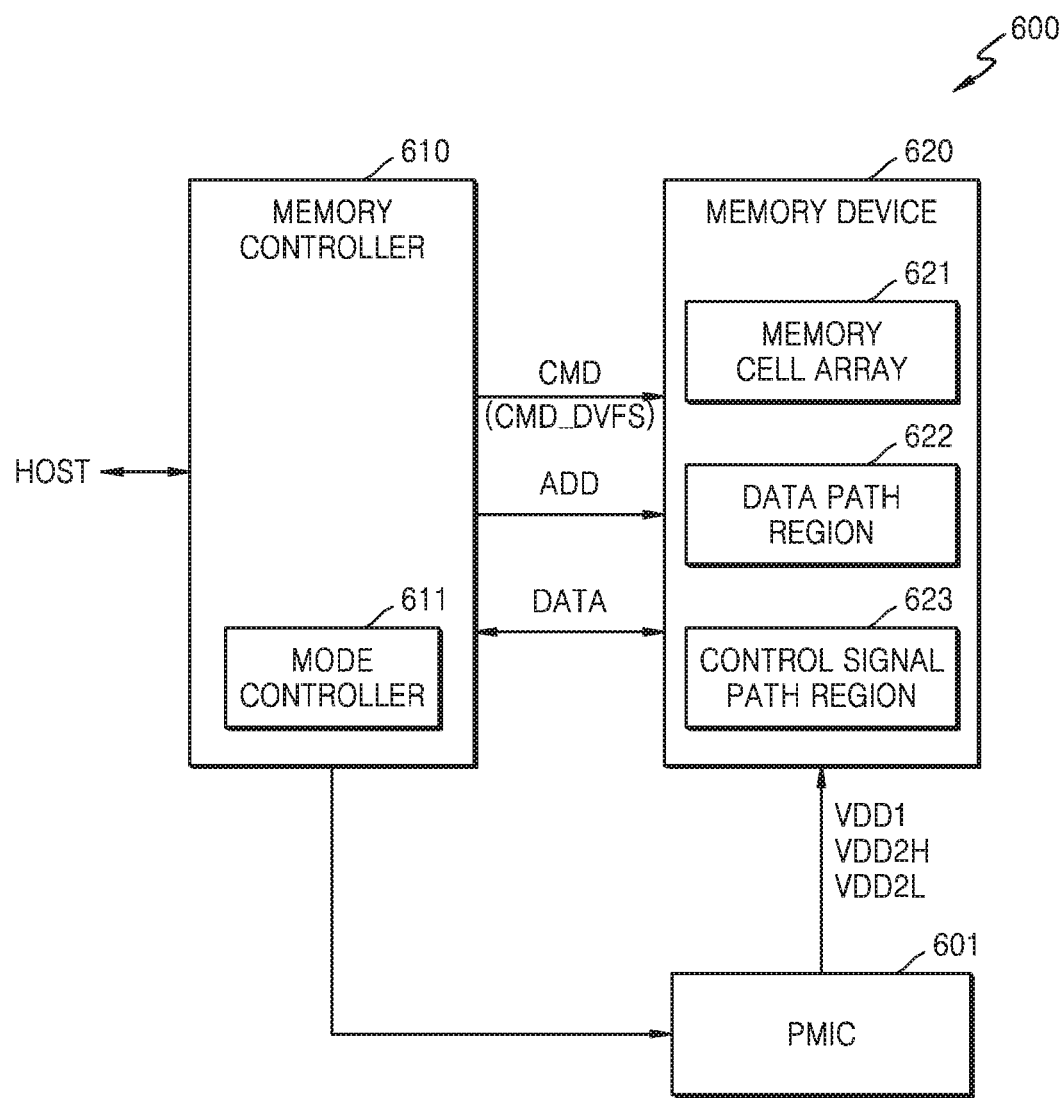
FIG. 12 is a block diagram illustrating a memory system including a memory device according to an embodiment of the inventive concept.

FIG. 12 is a block diagram illustrating a memory system 600 including a memory device according to an embodiment of the inventive concept.

Referring to FIG. 12, the memory system 600 may include a memory controller 610 and a memory device 620. The memory device 620 may include a memory cell array 621, a data path region 622, and a control signal path region 623. In addition, the memory controller 610 may include a mode controller 611. Here, a power management integrated circuit (PMIC) 601 may be further arranged in a data processing system mounted with the memory system 600. The PMIC 601 provides the first power voltage VDD1, the second high power voltage VDD2H, and the second low power voltage VDD2L to the memory device 620.

The mode controller 611 may control an operating mode of the memory device 620. For example, in accordance with various operation states (e.g., work load) with respect to the memory device 620, the operating mode of the memory device 620 may be a high performance mode or a low performance mode. Other than this, the mode controller 611 may control operating mode such that the memory device 620 enters a power down mode. In certain embodiments of the inventive concept, the memory controller 610 may control the PMIC 601. In the power down mode, the memory controller 610 may control whether to provide a power voltage to the memory device 620 by controlling the PMIC 601.

The memory controller 610 provides a command CMD and an address ADD to the memory device 620 and may transmit data DATA to and receive data DATA from the memory device 620. In addition, the memory controller 610 may provide a DVFS command CMD_DVFS to the memory device 620 based on a control result of the mode controller 611. The memory device 620 may provide the second high power voltage VDD2H or the second low power voltage VDD2L to the data path region 622 through internal switching operation in response to the DVFS command CMD_DVFS.

Figure 13:
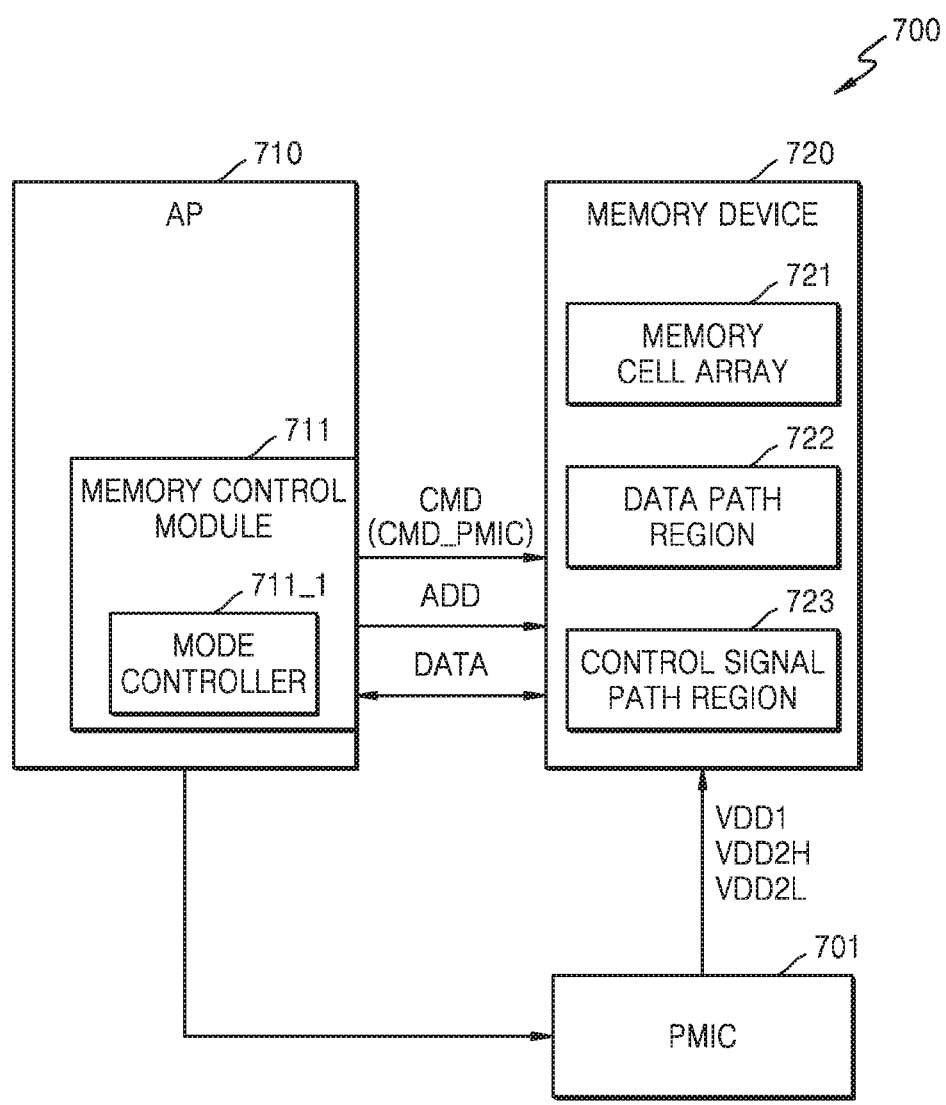
FIG. 13 is a block diagram illustrating a memory system according to another embodiment of the inventive concept.

FIG. 13 is a block diagram illustrating a memory system according to another embodiment of the inventive concept. In FIG. 13, a data processing system 700 including application processor 710 and a memory device 720 is illustrated. A memory control module 711 and a memory device 720 in the application processor 710 may configure a memory system. In addition, the memory device 720 may include a memory cell array 721, a data path region 722, and a control signal path region 723. In addition, the memory control module 711 may include a mode controller 711_1. In addition, the data processing system 700 may further include a PMIC 701.

The application processor 710 may be implemented by a system on chip (SoC). The SoC may include a system bus (not shown) to which a protocol having a predetermined standard bus specification is applied and may include various intellectual properties (IP) connected to the system bus. As a standard specification of the system bus, an advanced microcontroller bus architecture (AMBA) protocol of advanced RISC machine (ARM) may be applied. An AMBA protocol bus may be an advanced high-performance bus (AHB), an advance peripheral bus (APB), advanced extensible interface (AXI), AXI4, or AXI coherency extensions (ACE). uNetwork of SONICs Inc., CoreConnect of IBM, or Open Core Protocol of OCP-IP may be applied.

The memory device 720 may perform various operations related to the DVFS function according to the above-described embodiment. For example, the memory device 720 performs the internal switching operation in response to the DVFS command CMD_DVFS from the memory control module 711 so that the second high power voltage VDD2H or the second low power voltage VDD2L may be provided to the data path region 722.

While the inventive concept has been particularly shown and described with reference to embodiments thereof, it will be understood that various changes in form and details may be made therein without departing from the spirit and scope of the following claims.

What is claimed is:

1. A memory device comprising:
a memory cell array;
a data path region including data processing blocks that transmit write data to the memory cell array during a write operation and transmit read data from the memory cell array during a read operation; and
a control signal path region including control blocks that controlling the data processing blocks during the write operation and the read operation,
wherein the data path region selectively receives a first high power voltage or a first low power voltage in accordance with an operating mode of the memory device, and
the control signal path region receives the first high power voltage regardless of the operating mode.

2. The memory device of claim 1, wherein the memory device receives the first high power voltage, the first low power voltage, and a second power voltage from an external power management integrated circuit, and
the second power voltage has a higher level than the first high power voltage, and the first high power voltage has a higher level than the first low power voltage.

3. The memory device of claim 1, wherein each of the data processing blocks bidirectionally transmits the data in the data path region, and
each of the control blocks controls a transmission direction of the data by providing a control signal to the data processing block.

4. The memory device of claim 1, wherein the data path region comprises an input/output sense amplifier performing an amplification operation on data, an input/output gating circuit gating data in accordance with a column decoding result, and an input/output buffer transmitting and receiving data to and from an external circuit.

5. The memory device of claim 1, further comprising:
a switch unit including one or more switches that selectively provide the first high power voltage or the first low power voltage to the data path region; and
a switch controller that generates a switch control signal controlling the one or more switches.

6. The memory device of claim 5, wherein the switch controller generates the switch control signal based on a result of decoding a command provided from a memory controller, and
the switch unit comprises:
a first switch turned ON in the high performance operating mode to provide the first high power voltage to the data path region; and
a second switch turned ON in the low performance operating mode to provide the first low power voltage to the data path region.

7. The memory device of claim 1, further comprising:
a first power rail transmitting the first high power voltage;
a second power rail transmitting the first low power voltage;
a first internal power rail connected to the first power rail via a first switch and connected to the second power rail via a second switch; and
a second internal power rail connected to the first internal power rail via a third switch,
wherein the data path region receives the first high power voltage or the first low power voltage via at least one of the first internal power rail and the second internal power rail.

8. The memory device of claim 7, wherein the data path region comprises a plurality of data processing blocks, and
at least one of the plurality of data processing blocks receives the first high power voltage or the first low power voltage through the first internal power rail and other ones of the plurality of data processing blocks receive the first high power voltage or the first low power voltage through the second internal power rail.

9. The memory device of claim 7, wherein switching of the first switch and the second switch is controlled based on dynamic voltage and frequency scaling (DVFS) control, and
switching of the third switch is controlled based on power gating control.

10. The memory device of claim 1, wherein the data path region comprises M data processing blocks and the control signal path region includes M control blocks respectively corresponding to the M data processing blocks, where M is an integer greater than 1, and
the memory device further comprises a level shifter selectively arranged on at least one of the M control paths between the M data processing blocks and the M control blocks.

11. A memory device comprising:
a memory cell array;
a data path region including data processing blocks transmitting read data from the memory cell array during a read operation and transmitting write data to the memory cell array during a write operation;
a control signal path region including control blocks controlling the data processing blocks during the read operation and write operation;
first and second power rails transmitting power voltages used in the memory device; and
a switch unit including a plurality of switches controlling a connection state between the first and second power rails,
wherein the data path region is connected to the first power rail, the control signal path region is connected to the second power rail, the data path region receives at least two power voltages through the first power rail, and the control signal path region receives one power voltage through the second power rail.

12. The memory device of claim 11, wherein the data path region comprises an input/output sense amplifier for performing an amplification operation on data, an input/output gating circuit for gating data in accordance with a column decoding result, and an input/output buffer for transmitting and receiving data to and from an external circuit.

13. The memory device of claim 11, further comprising:
a third power rail transmitting a second high power voltage; and
a fourth power rail transmitting a second low power voltage,
wherein the memory device receives a first power voltage, the second high power voltage, and the second low power voltage from an external power management integrated circuit, the first power voltage has a higher level than the second high power voltage, and the second high power voltage has a higher level than the second low power voltage, and
wherein the switch unit comprises:
a first switch connecting the first power rail and the third power rail;
a second switch connecting the first power rail and the fourth power rail; and
a third switch connecting the second power rail and the third power rail.

14. The memory device of claim 13, wherein switching of the first switch and the second switch is controlled based on dynamic voltage and frequency scaling (DVFS) control.

15. A method of operating a memory device, wherein the memory device includes a data path region including data processing blocks processing data during memory operations and a control signal path region including control blocks controlling the data processing blocks during the memory operations, the method comprising:
providing a first high power voltage to the data path region and the control signal path region in a normal operating mode;
controlling a switch based on a dynamic voltage and frequency scaling (DVFS) operation as the memory device enters a low performance operating mode; and
continuously providing the first high power voltage to the control signal path region and providing a first low power voltage to the data path region in the low performance operating mode.

16. The method of claim 15, further comprising receiving a command from a memory controller,
wherein the first high power voltage or the first low power voltage is provided to the data path region as a result of decoding the command.

17. The method of claim 15, wherein the data path region is connected to a first power rail transmitting the first high power voltage or the first low power voltage in accordance with a selected operating mode and the control signal path region is connected to a second power rail for transmitting the first high power voltage regardless of the selected operating mode.

18. The memory device of claim 1, wherein the memory cell array receives the first high power voltage regardless of the operating mode.

19. The memory device of claim 11, wherein the memory cell array receives only the one power voltage through the second power rail.

20. The method of claim 15, wherein the memory device includes a memory cell array, and the method further comprises continuously providing the first high power voltage to the memory cell array in the low performance operating mode.

* * * * *